United States Patent
Kalman et al.

(10) Patent No.: US 8,201,130 B1
(45) Date of Patent: Jun. 12, 2012

(54) PARALLEL SIGNAL ROUTING

(75) Inventors: Sandor S. Kalman, Santa Clara, CA (US); Vinay Verma, Fremont, CA (US); Gitu Jain, Los Gatos, CA (US); Taneem Ahmed, Toronto (CA); Sanjeev Kwatra, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/939,732

(22) Filed: Nov. 4, 2010

(51) Int. Cl.
*G06F 17/50* (2006.01)

(52) U.S. Cl. ...................................... 716/126

(58) Field of Classification Search .................. 716/100, 716/126
See application file for complete search history.

(56) References Cited

U.S. PATENT DOCUMENTS

| | | | |
|---|---|---|---|
| 5,587,923 A | 12/1996 | Wang | |
| 5,784,289 A | 7/1998 | Wang | |
| 5,875,117 A * | 2/1999 | Jones et al. | 716/124 |
| 6,412,102 B1 | 6/2002 | Andreev et al. | |
| 6,480,991 B1 | 11/2002 | Cho et al. | |
| 7,134,112 B1 | 11/2006 | Anderson et al. | |
| 7,707,536 B2 | 4/2010 | Lin et al. | |
| 8,095,906 B2 * | 1/2012 | Betz et al. | 716/131 |
| 2001/0018759 A1 * | 8/2001 | Andreev et al. | 716/7 |
| 2002/0184607 A1 | 12/2002 | Alpert et al. | |
| 2003/0005398 A1 | 1/2003 | Cho et al. | |
| 2007/0094631 A1 * | 4/2007 | Galatenko et al. | 716/13 |
| 2007/0220522 A1 | 9/2007 | Coene et al. | |
| 2010/0169858 A1 * | 7/2010 | Betz et al. | 716/12 |

OTHER PUBLICATIONS

U.S. Appl. No. 12/718,945, filed Mar. 5, 2010, Jain et al.
U.S. Appl. No. 12/853,810, filed Aug. 10, 2010, Kingsley et al.
U.S. Appl. No. 12/939,765, filed Nov. 4, 2010, Verma et al.
McMurchie, Larry et al., "PathFinder: A Negotiation-Based Performance-Driven Router for FPGAs" *Proc. of the Third International ACM Symposium on Field-Programmable Gate Arrays*, Feb. 12, 1995, pp. 111-117, ACM, New York, New York, USA.

* cited by examiner

*Primary Examiner* — Suchin Parihar
(74) *Attorney, Agent, or Firm* — LeRoy D. Maunu (57) ABSTRACT

A method is provided for routing a circuit design netlist. Nets of the netlist are grouped into a plurality of sub-netlists. For each sub-netlist, nets of the sub-netlist are routed as a function of congestion between nets of the sub-netlist. Congestion between nets of other sub-netlists in the plurality of sub-netlists is not taken into account. If two or more nets of the netlist are routed through the same routing resource, a global congestion history data set is updated to describe congestion between all nets in the netlist, and the two or more nets of the netlist are unrouted. The two or more nets are each rerouted as a function of the global congestion history data set and congestion between nets of the same sub-netlist as the net.

18 Claims, 6 Drawing Sheets

PARALLEL SIGNAL ROUTING

FIELD OF THE INVENTION

The embodiments of the present invention generally relate to the placement and routing of circuits.

BACKGROUND

Programmable integrated circuits (ICs) are often used to implement digital logic operations according to user configurable input. Example programmable ICs include Complex Programmable Logic Devices (CPLDs) and field programmable gate arrays (FPGAs). CPLDs often include several function blocks that are based on programmable logic array (PLA) architecture with sum-of-products logic. A configurable interconnect matrix transmits signals between the function blocks.

An example FPGA includes an array of configurable logic blocks (CLBs) and a ring or columns of programmable input/output blocks (IOBs). The CLBs and IOBs are interconnected by a programmable interconnect structure (routing resources). The CLBs, IOBs, and interconnect structure are typically programmed by loading a stream of configuration data (bitstream) into internal configuration memory cells that determine how the CLBs, IOBs, and interconnect structure function. The configuration bitstream may be read from an external memory, conventionally an external integrated circuit memory EEPROM, EPROM, PROM, and the like, though other types of memory may be used. The collective states of the individual memory cells determine the function of the FPGA. A specific type of FPGA uses a look-up-table (LUT)-based CLB. The configuration memory provides input values to a number of multiplexers that are controlled by inputs to the CLB.

A conventional design process for an integrated circuit, such as an ASIC or an FPGA implementation begins with the creation of the design. The design specifies the function of a circuit at a schematic or logic level and may be represented using various hardware description languages (e.g., VHDL, ABEL, or Verilog) or schematic capture programs. The design is synthesized to produce a logical network list ("netlist"), and the synthesized design is mapped onto primitive components within the target device (e.g., programmable logic blocks of an FPGA).

Following mapping, placement of the components of the synthesized and mapped design is then performed for the target device. During placement, each mapped component of the design is assigned to a physical position on the chip. The placer attempts to place connected design objects in close physical proximity to one another in order to conserve space and increase the probability that the desired interconnections between components will be successfully completed by the router. Placing connected components close to one another also generally improves the performance of the circuit, since long interconnect paths are associated with excess capacitance and resistance, resulting in longer delays and greater power consumption.

Specified connections between components of the design are routed within the target device for the placed components. The routing process specifies physical wiring resources that will be used to conduct signals between pins of placed components of the design. For each connection specified in the design, the routing process allocates wire resources necessary to complete the connection. As used herein, the selection and assignment of wire resources in connecting the output pin of one component to the input pin of another component is referred to as routing a net. When nets have been routed using most or all of the wiring resources in a given area, the area is generally referred to as congested, which creates competition for the remaining wiring resources in the area or makes routing of additional nets in the area impossible.

The disclosed embodiments may address one or more of the above issues.

SUMMARY

In one embodiment, a method is provided for deterministic parallel routing of a placed circuit design netlist using one or more programmed processors. Nets of the netlist are grouped into a plurality of sub-netlists, each sub-netlist including one or more of the nets. For each sub-netlist, each net of the sub-netlist is routed as a function of congestion between nets of the sub-netlist. Congestion between nets of other sub-netlists in the plurality of sub-netlists is not taken into account. After routing each net of each sub-netlist, if two or more nets of the netlist are routed through the same routing resource, a global congestion history data set is updated to describe congestion between all nets in the netlist, and the two or more nets of the netlist are unrouted. Each of the two or more nets is routed as a function of the global congestion history data set and congestion between nets of the sub-netlist that includes the net. The routing function is not being dependent on congestion between nets of other sub-netlists in the plurality of sub-netlists.

In another embodiment, after routing the nets as a function of congestion between nets of the sub-netlist, the nets of the netlist are merged and the two or more nets that are routed through the one routing resource are determined. After routing each of the two or more nets of the netlist as a function of the global congestion history data set and congestion between nets of the sub-netlist of the net, the nets of the netlist are again merged and nets that are routed through a routing resource with another net are determined.

In response to the two or more nets of the netlist being routed through the one routing resource, in another embodiment, the two or more nets of the netlist are grouped into a revised set of sub-netlists. The routing the two or more nets of the netlist includes routing each of the two or more nets as a function of the global congestion history data set and congestion between nets within the sub-netlist of the revised set of sub-netlists that includes the net.

The grouping of nets of the netlist into sub-netlists includes deterministically grouping nets in another embodiment.

In another embodiment, the routing of nets of each sub-netlist as a function of congestion between nets of the sub-netlist includes deterministically routing the nets of each sub-netlist in series. The routing of each of the two or more nets of the netlist as a function of the global congestion history data set and congestion between nets within the sub-netlist that includes the net, deterministically routes the two or more nets within the sub-netlist in series.

The routing of nets for each sub-netlist as a function of congestion between nets of the sub-netlist, in another embodiment, includes routing one or more nets of a first one of the sub-netlists in parallel with routing one or more nets of at least a second one of the sub-netlists using a plurality of processors.

In another embodiment, the routing of the two or more nets of the netlist includes routing one or more nets of the two or more nets within a first one of the sub-netlists in parallel with routing one or more nets of the two or more nets within at least a second one of the sub-netlists using a plurality of processors.

The routing of nets for each sub-netlist as a function of congestion between nets of the sub-netlist, in another embodiment, includes routing nets of the first one of the sub-netlists sequentially with nets of at least a third one of the sub-netlists using one of the plurality of processors.

The number of sub-netlists is greater than the number of processors in the plurality of processors in another embodiment.

The number of sub-netlists is equal to the number of nets in the netlist in another embodiment.

In another embodiment, a system for routing of a circuit design is provided. The system includes a plurality of processors and a memory arrangement coupled to the plurality of processors. The memory arrangement is configured with instructions that when executed by one or more of the plurality of processors cause the plurality of processors to group nets of the netlist into a plurality of sub-netlists, each sub-netlist including one or more nets. For each sub-netlist, the instructions cause a respective processor to route each net in the sub-netlist as a function of congestion between nets of the sub-netlist. The routing function is not dependent on congestion between nets of other sub-netlists in the plurality of sub-netlists. In response to two or more nets of the netlist being routed through the same routing resource after routing each net of each sub-netlist, a global congestion history data set is updated to describe congestion between all nets in the netlist and the two or more nets of the netlist are unrouted. For each of the two or more nets, the net is routed as a function of the global congestion history data set and congestion between nets in the same sub-netlist as the net. The routing function is not dependent on congestion between nets of other sub-netlists in the plurality of sub-netlists.

After the routing of the nets as a function of congestion between nets of the sub-netlist, in another embodiment the instructions further cause the plurality of processors to merge the nets of the netlist and determine the two or more nets that are routed through the one routing resource. After the routing each of the two or more nets of the netlist as a function of the global congestion history data set and congestion between nets of the sub-netlist that includes the net, the instructions cause one or more of the plurality of processors to merge the routed nets of the netlist and determine nets that are routed through a routing resource used to route another net.

In another embodiment, the instructions further cause the plurality of processors to group the two or more nets of the netlist into a revised set of sub-netlists in response to the two or more nets of the netlist being routed through the one routing resource. The routing the two or more nets of the netlist routes each of the two or more nets of the netlist as a function of the global congestion history data set and congestion between nets of sub-netlist of the revised set of sub-netlists that includes the net.

The grouping of nets of the netlist into sub-netlists consists of deterministically grouping nets in another embodiment.

In another embodiment, the routing of nets of each sub-netlist as a function of congestion between nets of the sub-netlist deterministically routes the nets of each sub-netlist in series. The routing of each of the two or more nets of the netlist as a function of the global congestion history data set and congestion between nets within the sub-netlist that includes the net deterministically routes nets of the two or more nets within each sub-netlist in series.

The routing of nets for each sub-netlist as a function of congestion between nets of the sub-netlist, in another embodiment routes one or more nets of a first one of the sub-netlists in parallel with routing one or more nets of at least a second one of the sub-netlists using a plurality of processors.

The routing of the two or more nets of the netlist, in another embodiment, routes one or more nets of the two or more nets within a first one of the sub-netlists in parallel with one or more nets of the two or more nets within at least a second one of the sub-netlists using a plurality of processors.

In another embodiment, the routing of nets for each sub-netlist as a function of congestion between nets of the sub-netlist routes nets of the first one of the sub-netlists prior to routing nets of at least a third one of the sub-netlists.

In yet another embodiment, an article of manufacture is provided. The article includes a non-transitory processor-readable storage medium configured with processor-executable instructions. The instructions, when executed by a plurality of processors, cause the plurality of processors to group nets of the netlist into a plurality of sub-netlists. Each sub-netlist includes one or more of the nets. For each sub-netlist, each net in the sub-netlist is routed as a function of congestion between nets of the sub-netlist. The routing function is not dependent on congestion between nets of other sub-netlists in the plurality of sub-netlists. After routing each net of each sub-netlist, the instructions further cause the processors, in response to two or more nets of the netlist being routed through one routing resource, to update a global congestion history data set to describe congestion between all nets in the netlist and to unroute the two or more nets. For each of the two or more nets, a respective one of the plurality of processors is configured to route the net as a function of the global congestion history data set and congestion between nets of the sub-netlist that includes the net. The routing function is not dependent on congestion between nets of other sub-netlists in the plurality of sub-netlists.

The instructions, in another embodiment, further cause the plurality of processors, after the routing of the nets as a function of congestion between nets of the sub-netlist, to merge the nets of the netlist and determine the two or more nets that are routed through the one routing resource. The instructions further cause the plurality of processors, after routing each of the two or more nets of the netlist as a function of the global congestion history data set and congestion between nets of the same sub-netlist as the net, to merge the routed nets of the netlist and determine nets that are routed through a routing resource with another net.

It will be appreciated that various other embodiments are set forth in the Detailed Description and Claims, which follow.

BRIEF DESCRIPTION OF THE DRAWINGS

Various aspects and advantages of the described embodiments will become apparent upon review of the following detailed description and upon reference to the drawings, in which.

DETAILED DESCRIPTION

Routing algorithms used to route nets of a circuit design netlist may be deterministic or non-deterministic. Non-deterministic algorithms generally utilize a random seed to produce a random number that is used to select circuits for placement and routing. One disadvantage of non-deterministic algorithms is that they do not consistently produce satisfactory results. Execution of the algorithm may produce routes above or below the mean efficiency. Due to this uncertainty, non-deterministic algorithms may be required to be executed a large number of times before satisfactory results are achieved and confirmed. In each iteration, results are compared and the best route is used. In contrast, deterministic algorithms use a specific, unchanging method to determine optimal placement and routing. Deterministic algorithms are advantageous in that satisfactory results are consistently achieved after a single run. Some integrated circuit designs have a requirement that their performance (clock frequency) should not change. After the IP is tuned in factory, it is expected to produce the same deterministic results in each customer run.

The process of finding a valid route for all nets and that minimizes some measure of cost is an NP-Hard problem. In the future, it is expected that processor cores will not increase in speed, but computers will be built with many cores that execute processes in parallel. Utilizing a multi-core architecture, one method to reduce the time needed for signal routing involves routing nets in parallel using multiple processors. However, due to race conditions, parallel routing of nets may produce non-deterministic results. One or more embodiments of the present invention provide a deterministic method for parallel routing of a netlist.

Many current programmable integrated circuit (IC) routing tools are based on a negotiated congestion resolution scheme. In a typical implementation, for example, the Pathfinder algorithm, nets are routed sequentially. A path through the programmable resources of the programmable IC is determined by an expansion of possible paths from a source to a destination. In the process of routing a net, other nets may have been already routed on the wire resources required to route the unrouted signal. When two nets use the same resource, it is known as congestion. During expansion, a cost of resource use for each possible path is tracked and maintained during expansion of the possible paths to reflect the demand for use of each resource for routing. In response to two or more nets attempting to route with the same resource, the cost of the congested resource is increased, and the conflicting nets are rerouted. The increased resource cost encourages any subsequently routed nets to be routed using other (less expensive) resources. A net having limited routing resources available to provide a possible path from the source to the destination may use the congested resources if those resources provide the least expensive path in spite of their increased cost. In this manner, nets are iteratively routed while adjusting resource costs to find a solution.

Because the routing of each net increases the cost of some resources, the routing of subsequently routed nets may be affected. The final routing result is determined, in part, by the order in which nets are routed. Therefore, in order to produce deterministic results, the nets must be routed in the same order every time routing is performed. However, when two or more nets are routed in parallel, it can be difficult to control the order in which nets are routed due to unexpected or critical dependences known as race conditions. For example, when a processor performs a read of a memory, the time to complete the memory access may depend on the number of other processes attempting to perform read operations. Also all processors may not be clocked at the same speed. The order in which concurrently routed nets are routed may be similarly affected by memory access delays as the processors attempt to read and update congestion data or the clock speed of the processor.

One embodiment of the present invention facilitates independent parallel routing by grouping nets of the netlist into sub-netlists and routing the sub-netlists in parallel with congestion data maintained in independent sets. The independent sets of congestion data ensure that routing of one sub-netlist does not affect the congestion data used in routing of the other sub-netlists. As a result, two or more nets from different sub-netlists may be routed through the same routing resource. These are referred to as conflicting nets.

Once each subnet is routed, the routing and congestion data are synchronized. At this synchronization point, the routed subnets are combined and analyzed to identify conflicting nets and determine a global set of congestion data that reflects the demand for the routing resources by all nets of the netlist.

The conflicting nets may then be rerouted with corresponding congestion data updated to the global set of congestion data. Because congestion data is updated for each of the conflicting nets at the same time (e.g. before any of the conflicting nets are rerouted), race conditions leading to non-determinism are avoided.

As used herein, nets routed in parallel refers to nets that are routed concurrently in time on separate processors. Nets routed in series refers to nets that are routed sequentially in time on one or more processors.

Figure 1:
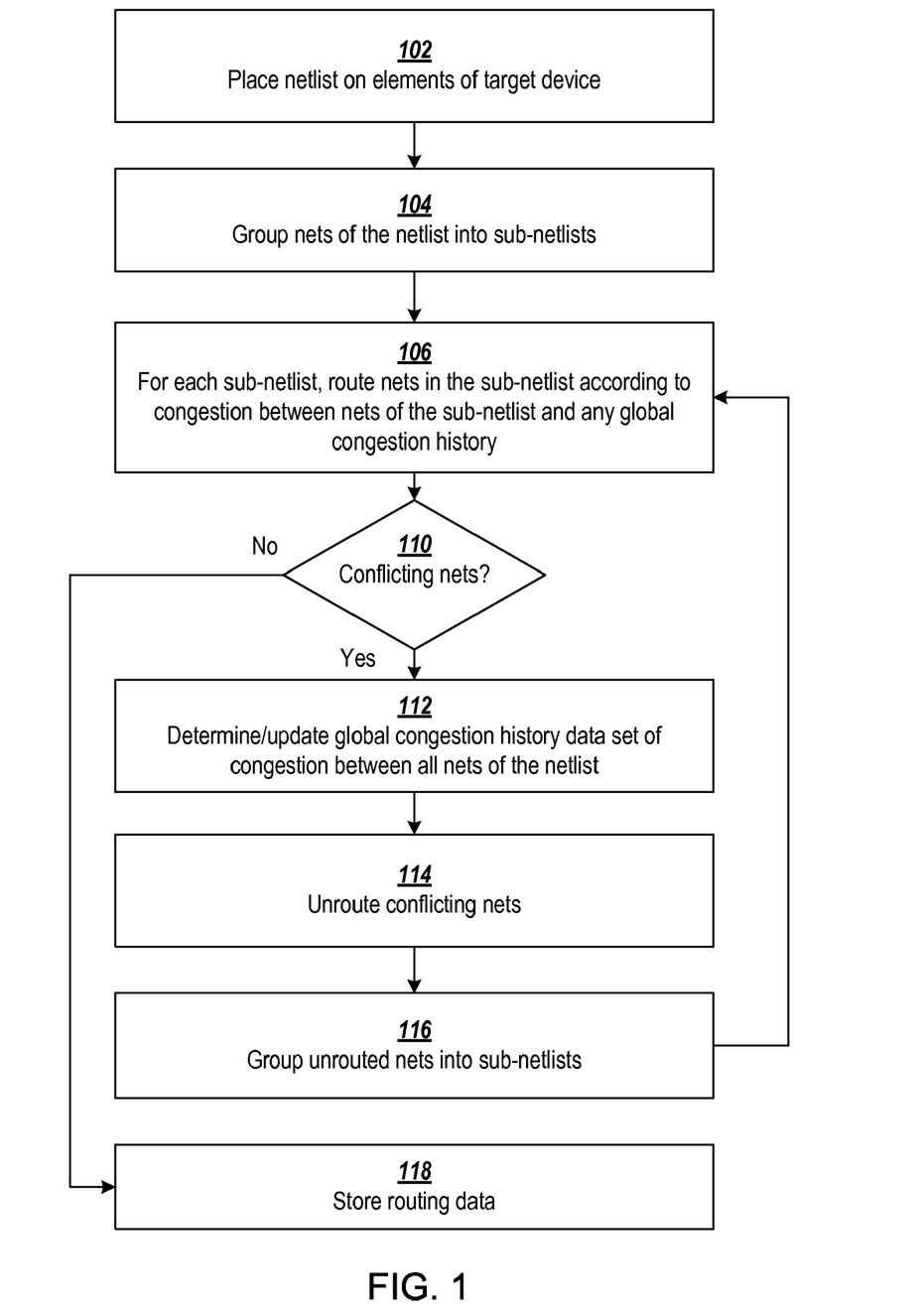
FIG. 1 shows a flowchart of an example process for performing deterministic parallel routing of a circuit design netlist.

FIG. 1 shows a flowchart of an example process for performing deterministic parallel routing of a circuit design netlist. A netlist is placed on elements of a target device at block 102. Nets are grouped into a plurality of sub-netlists at block 104. Nets may be grouped according to a number of different algorithms. However, in order to achieve deterministic results the grouping algorithm should be a deterministic algorithm. For each sub-netlist, nets are routed according to congestion data between nets of the sub-netlist at block 106. The congestion data for each sub-netlist is maintained in an independent local set of congestion data. If the netlist includes conflicting nets at block 110, a set of global congestion history reflecting congestion between all nets of the netlist is determined at block 112.

Conflicting nets are unrouted at block 114. The unrouted nets are grouped into a new set of sub-netlists at block 116. Each sub-netlist is routed according to the global congestion history determined at block 112 as supplemented by an independent set of local congestion data. While routing each sub-netlist, the independent local set of congestion data is used to track and maintain congestion between nets of the sub-netlist. The global congestion history is not modified until it is updated at block 112. The processes of updating global congestion data at block 112, unrouting and grouping conflicting nets into sub-netlists at blocks 114 and 116, and routing the subnets at block 106 are repeated until there are no conflicting nets at decision block 110. Once the netlist is routed with no conflicting nets, the routing data is stored at block 118.

Nets may be routed using a number of different congestion resolution-based routing algorithms including, for example, Pathfinder, maze routing, A* search routing, versatile place and route, ROAD, etc.

Since the sub-netlists are routed with independent sets of local congestion data and are unaffected by the routing of other nets, the sub-netlists may be routed in any order and deterministic results achieved. One skilled in the art will recognize that the plurality of sub-netlists may be routed in parallel, sequentially, or any sub-combination thereof, so long as the sub-netlists and congestion data are merged at a synchronization step once all sub-nets are independently routed.

For example, in one embodiment, the number of sub-netlists is equal to the number of processors and all sub-netlists are routed in parallel. In another embodiment, the number of sub-netlists may be greater than the number of processors available for routing the sub-netlists. In one implementation, processors may each be assigned one of the sub-netlists, which the processors route in parallel. When a processor finishes routing a sub-netlist, the processor can begin routing another sub-netlist until all sub-netlists have been routed. In yet another embodiment, a scheduling algorithm may be implemented to schedule processing time for routing of the sub-netlists with the processors.

The above embodiments are described as performing parallel routing using multiple processors. One skilled in the art will recognize that parallel processing may be performed on a number of different computing architectures, including performing concurrent process threads on multiple processors, on a multi-core processor, or on multiple networked computing systems.

Figure 2:
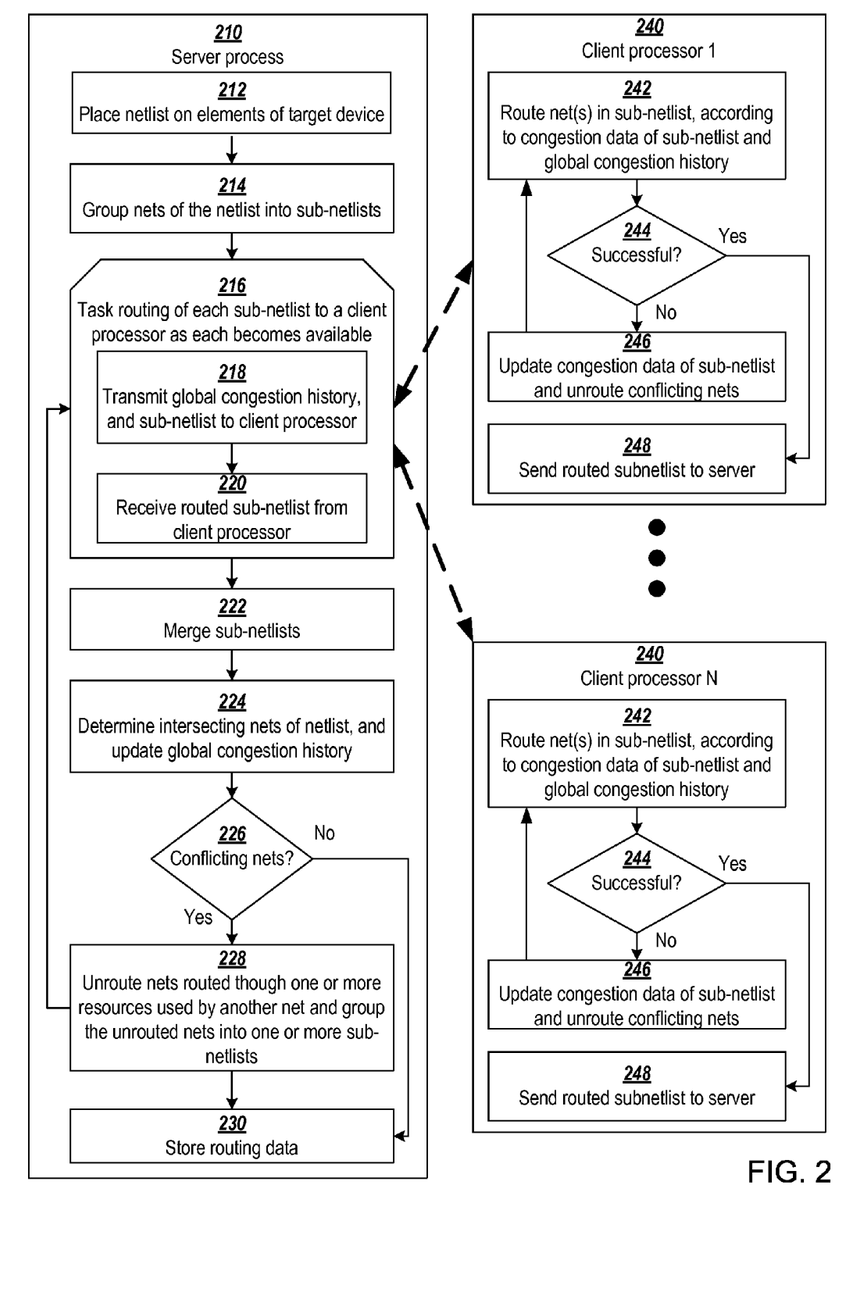
FIG. 2 shows a flowchart of an example process for performing deterministic parallel routing of a circuit design in a distributed processing system.

FIG. 2 shows a flowchart of an example process for parallel routing of a netlist on a distributed system of processors. A server process 210 divides the netlist into a plurality of sub-netlists, assigns work to different processors, and controls synchronization between the parallel-executed threads. Circuits described in a netlist are placed on hardware elements of a target device at block 212. Nets of the netlist are grouped into a number of sub-netlists at block 214. Sub-netlists are assigned to processors for routing at block 216. For each sub-netlist, a set of global congestion history and the sub-netlist are transmitted to a selected client processor at block 218. In a non-distributed system, the congestion data and sub-netlist data may be available to the processor and server process 210 need only assign the sub-netlist to the processor at block 216. It is also noted that the first time a netlist is partitioned into sub-netlists and routed, there is no global congestion history. As a result, each sub-netlist will be initially routed as if no other nets are routed.

Client processor(s) 240 illustrate the routing process performed by a processor in routing one sub-netlist. The assigned sub-netlist is routed at block 218 according to an independent set of local congestion data that is updated during routing and according to the global congestion history transmitted in block 218 (if available). The independent local set of congestion data is modified as nets of the sub-netlist are routed. The global congestion data is not modified until routing of all the sub-netlists is completed. The global congestion history and congestion data can be thought of as a private set of congestion data that is initialized to the transmitted global congestion history data.

If routing of the sub-netlist is unsuccessful at decision block 244, the local congestion data is updated and conflicting nets are unrouted at block 246. Routing at block 242 is repeated until routing of all nets in the sub-netlist is successful at decision block 244. Once routing of the sub-netlist is completed, the routed sub-netlist and the independent set of local congestion data are transmitted back to server process 210, which receives the data at block 220.

When all sub-netlists have been routed and received at block 220, the sub-netlists are merged at block 222. Conflicting nets of the merged netlist are determined and the global congestion history between all nets of the netlist is updated at block 224. If there are conflicting nets (e.g., nets being routed through the same routing resource) as found at decision block 226, the conflicting nets are unrouted and grouped into a new set of sub-netlists at block 228. The sub-netlists are assigned to processors for routing at block 216 and the process is repeated until there are no intersecting nets found by decision block 226.

Figure 3:
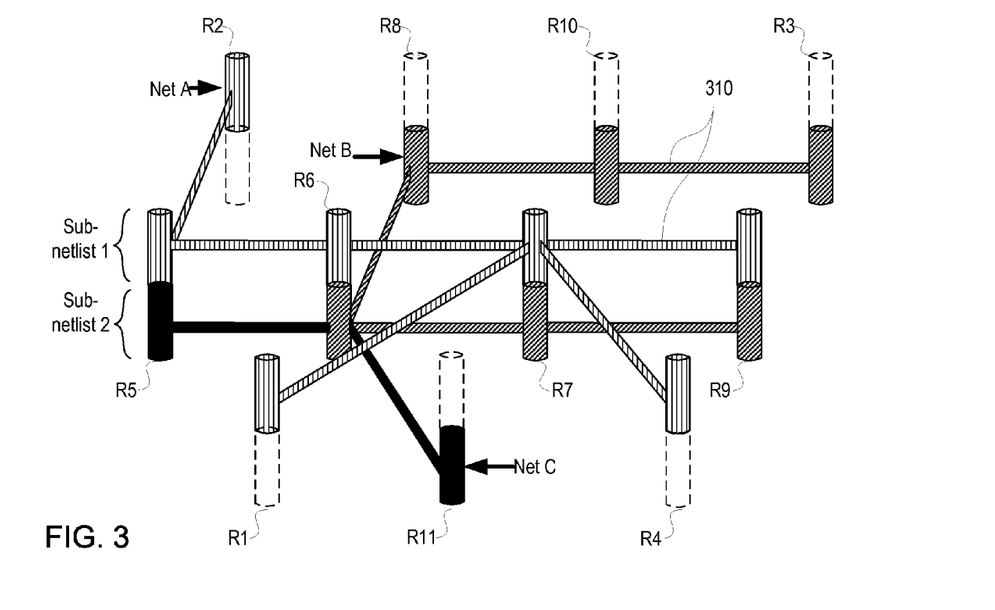
FIG. 3 illustrates the routing of an example netlist in sub-netlists.
Figure 4:
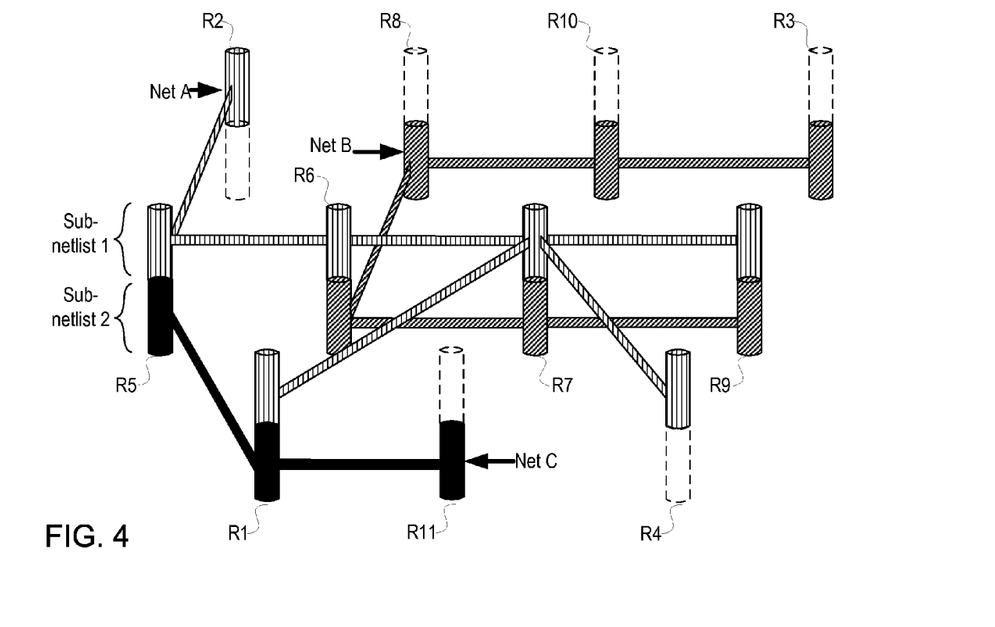
FIG. 4 illustrates the routing example of FIG. 3 after further routing of the sub-netlists.

FIG. 3 and FIG. 4 illustrate the routing of an example netlist. In this example, the netlist includes three nets A, B, and C, which are grouped into two sub-netlists for parallel routing with two processors. The nets are routed through routing resources R1 through R11, which are depicted as vertical columns. Paths created by routing through the resources are depicted by connecting lines 310. Net A is assigned in sub-netlist 1, and nets B and C are grouped in sub-netlist 2. The processor assigned to route each sub-netlist is assigned read-only access to the last updated global congestion history data (if available) and read/write access to a respective local set of congestion data associated with the corresponding sub-netlist.

As illustrated in FIG. 3, each sub-netlist can be thought of as being routed in a separate layer with identical routing resources in each layer. Sub-netlist 1, including net A, is shown routed in the top layer. Sub-netlist 2, including nets B and C, is shown partially routed in the lower layer. At this point, routing of sub-netlist 1 has completed. However, nets B and C of the second sub-netlist both utilize routing resource R6 and will have to be rerouted before routing of the sub-netlist is completed. FIG. 4 illustrates the sub-netlists routing shown in FIG. 3 after net C of sub-netlist 2 is rerouted through resource R1 to avoid congested resource R6. At this point, sub-netlist routing is complete.

Figure 5:
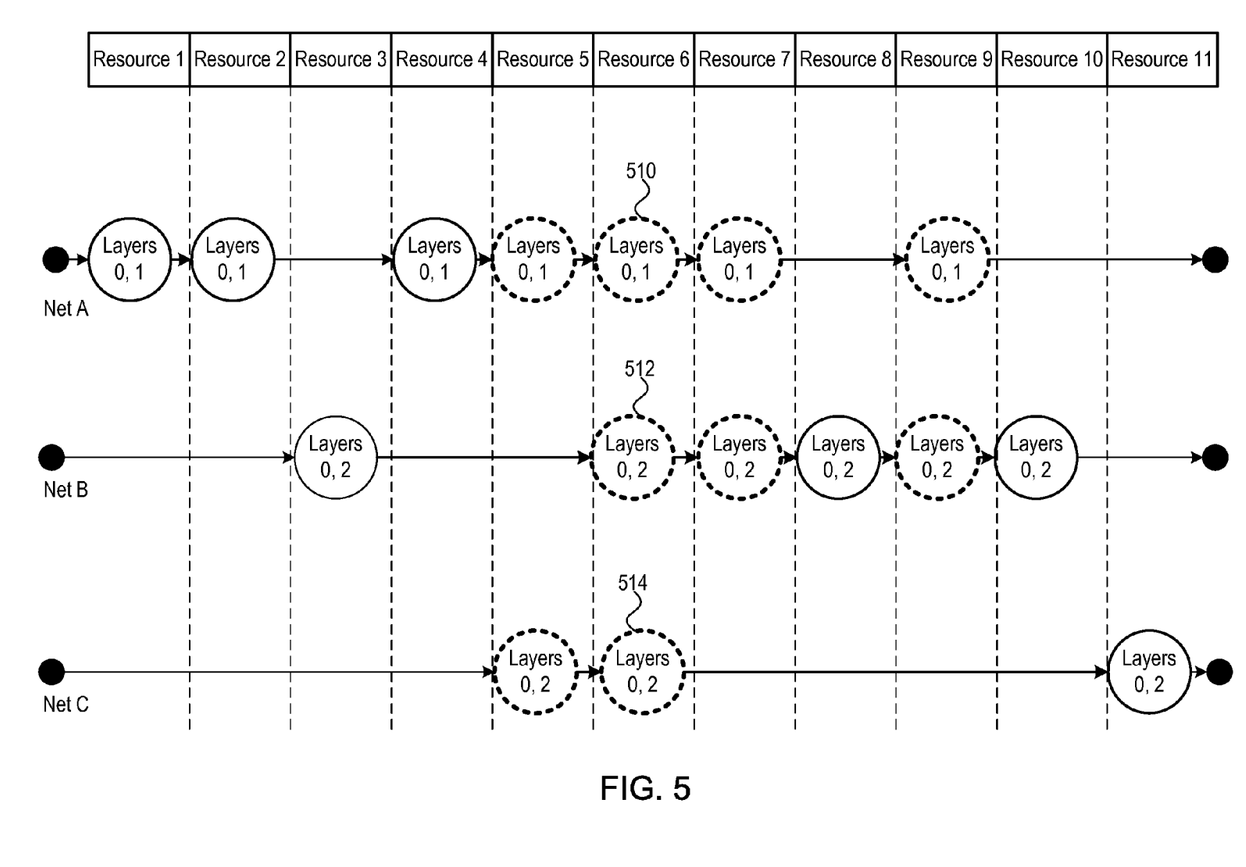
FIG. 5 shows an example resource map for tracking the routing of the sub-netlists shown in FIG. 3.

FIG. 5 shows an example resource map for tracking the routing of the sub-netlists shown in FIG. 3. The routing of a net is represented as a list of routing resources. For example, dashed circles 510, 512, and 514 are instances that illustrate use of resource R6 by nets A, B, and C respectively. Each instance includes visibility values to determine whether that instance is to be used in calculating the current congestion value for a given sub-netlist. As shown in this example, each instance includes a first visibility indicator 0 (corresponding to the global congestion data or "layer 0"), and includes a second additional visibility indicator corresponding to an associated sub-netlist (or "layer"). As shown, instances corresponding to Net A may be used in determining congestion data for the global set of congestion data (layer 0) and sub-netlist 1 (layer 1). Instances corresponding to Nets B and C may be used in determining congestion data for the global set of congestion data (layer 0) and sub-netlist 2 (layer 2). The algorithm can decide the visibility of a routing resource for a particular sub-netlist and use it to compute the congestion cost of each resource as seen by that particular sub-netlist. The visibility is dynamic and can change based upon a processors view of congestion.

Because sub-netlists 1 and 2 are routed with independent sets of local congestion data, each sub-netlist may have different congestion data indicated by the respective set of independent set of local congestion data. Global congestion data is not modifiable during sub-netlist routing and will retain the same value for each resource instance while routing. Depending upon the sub-netlist that is visible to a processor, the congestion count of a resource can vary. For example, assume that the global congestion history of resource R6 was equal to 0 prior to routing. During the routing of net A, the cost of resource R6 is increased in the local congestion data for sub-netlist by a value of 1. During the routing of a first one of nets B or C, the cost of resource R6 is similarly increased in the local congestion data for sub-netlist 2 by a value of 1. When a second one of nets B or C is routed through resource R6, as shown in FIGS. 3 and 5, the resource cost is further increased to a value of 2 because routing instances 512 and 514 are both visible to sub-netlist 2. If global congestion history is updated at this point, the resource cost of resource R6 would be increased by a value of 3 to reflect the demand of all resource instances 510, 512, and 514 that include visibility indicator 0.

In one implementation, the sub-netlists may be identified with a k-bit identifier. In this manner up to 2^k different sub-netlists may be identified. The number of bits can be scaled up if there is need for more sub-netlist indicators. The visibility indicator of a resource as discussed in relation to FIG. 5, may be represented by a bit mask ("visibility mask"). This implementation allows for computationally efficient determination of conflicting nets. For example, using the visibility mask, the number of nets associated with a particular sub-netlist that share a routing resource may be calculated in an operation having a constant time complexity. The bit mask for a particular resource may be computed in the time complexity $O(k)$ where k is the number of bits in the number. If N nets in a netlist are routed through a particular resource, the computation of congestion for a particular sub-netlist may be performed with a time complexity of $O(nk)$.

Figure 6:
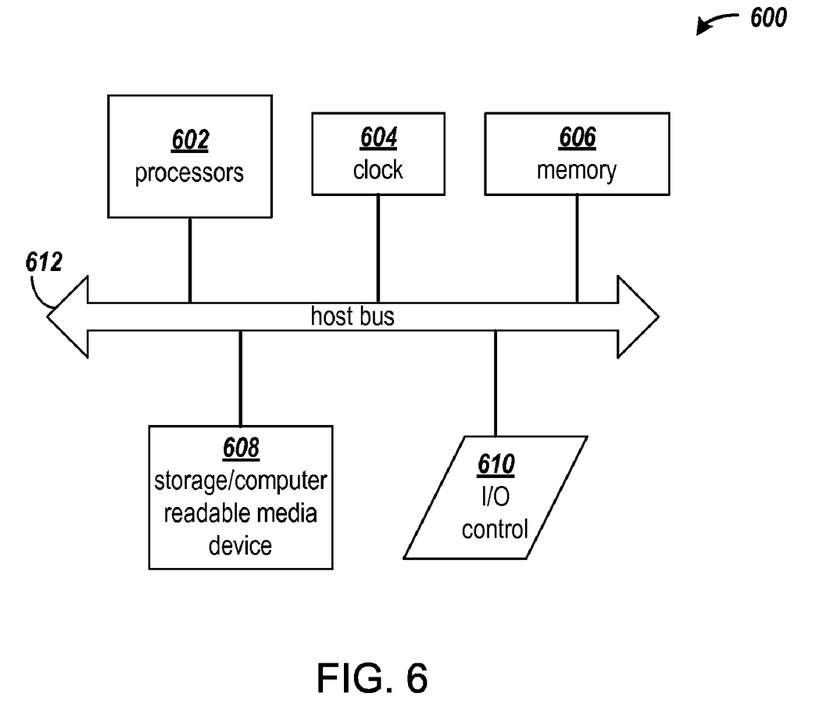
FIG. 6 illustrates a block diagram of a general-purpose processor computing arrangement for performing routing processes.

FIG. 6 illustrates a block diagram of a computing arrangement that may be configured to implement the routing processes described herein. Those skilled in the art will appreciate that various alternative computing arrangements, including a plurality of processors and a memory arrangement configured with program code, would be suitable for hosting the processes and data structures and implementing the described processes. The program code, encoded in a processor executable format, may be stored and provided via a variety of computer-readable storage media or delivery channels such as magnetic or optical disks or tapes, electronic storage devices, or as application services over a network.

Processor computing arrangement 600 includes two or more processors 602, a clock signal generator 604, a memory unit 606, a storage unit 608, and an input/output control unit 610 coupled to host bus 612. The arrangement 600 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 602 may be one or more general-purpose processors, or a combination of one or more general-purpose processors and suitable co-processors, or one or more specialized processors (e.g., RISC, CISC, pipelined, etc.).

The memory arrangement 606 typically includes multiple levels of cache memory and a main memory. The storage arrangement 608 may include local and/or remote persistent storage such as provided by magnetic disks (not shown), flash, EPROM, or other non-volatile data storage. The storage unit may be read or read/write capable. Further, the memory 606 and storage 608 may be combined in a single arrangement.

The processor arrangement 602 executes the software in storage 608 and/or memory 606 arrangements, reads data from and stores data to the storage 608 and/or memory 606 arrangements, and communicates with external devices through the input/output control arrangement 610. These functions are synchronized by the clock signal generator 604. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures of the described embodiments.

Figure 7:
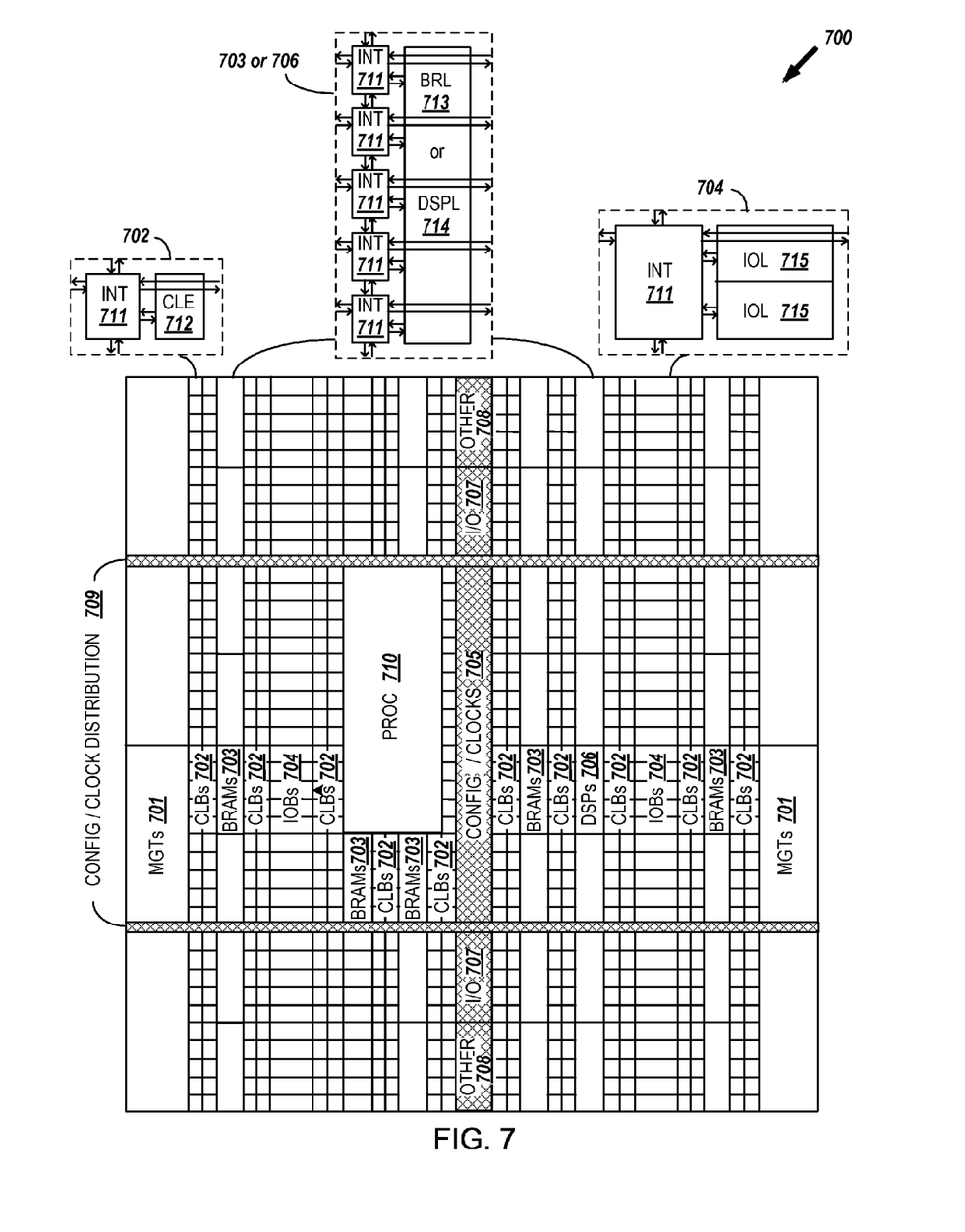
FIG. 7 illustrates a block diagram of an example programmable integrated circuit target device for routing of a circuit design.

FIG. 7 is a block diagram of an example field programmable gate array (FPGA) which may be used as an exemplary target device for place-and-route for the described embodiments. FPGAs can include several different types of programmable logic blocks in the array. For example, FIG. 7 illustrates an FPGA architecture (700) that includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707), for example, clock ports, and other programmable logic 708 such as digital clock managers, analog-to-digital converters, system monitoring logic, and so forth. Some FPGAs also include dedicated processor blocks (PROC 710). While not shown, it will be appreciated that FPGA 700 also includes external and internal reconfiguration ports.

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element INT 711 also includes the connections to and from the programmable logic element within the same tile, as shown by the examples included at the top of FIG. 7.

For example, a CLB 702 can include a configurable logic element CLE 712 that can be programmed to implement user logic plus a single programmable interconnect element INT 711. A BRAM 703 can include a BRAM logic element (BRL 713) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used.

A DSP tile 706 can include a DSP logic element (DSPL 714) in addition to an appropriate number of programmable interconnect elements. With the FPGA as the target device, an inference pattern would be provided for the DSP logic element(s) available on the device. If portions of the design are found to be optimal, after timing analysis, those portions would be implemented by the DSP elements.

An IOB 704 can include, for example, two instances of an input/output logic element (IOL 715) in addition to one instance of the programmable interconnect element INT 711. As will be clear to those of skill in the art, the actual I/O pads connected, for example, to the I/O logic element 715 are manufactured using metal layered above the various illustrated logic blocks, and typically are not confined to the area of the input/output logic element 715.

In the pictured embodiment, a columnar area near the center of the die (shown shaded in FIG. 7) is used for configuration, clock, and other control logic. Horizontal areas 709 extending from this column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

The embodiments of the present invention are thought to be applicable to a variety of systems and methods for routing circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for deterministic routing of a placed circuit design netlist, comprising:
grouping nets of the netlist into a plurality of sub-netlists, each sub-netlist including one or more of the nets;
for each sub-netlist, routing each net in the sub-netlist by a programmed processor as a function of congestion between nets of the sub-netlist, the function not being dependent on congestion between nets of other sub-netlists in the plurality of sub-netlists; and
after routing each net of each sub-netlist and in response to two or more nets of the netlist being routed through one routing resource, performing steps including:
grouping the two or more nets of the netlist into a revised set of sub-netlists;
updating a global congestion history data set with congestion data that describe congestion between all nets in the netlist;
undoing routes of the two or more nets of the netlist through the one routing resource; and
for each of the two or more nets, routing the net as a function of the global congestion history data set and congestion between nets of the revised set of sub-netlists that includes the net, the function not being dependent on congestion between nets of other sub-netlists in the plurality of sub-netlists.

2. The method of claim 1, further comprising:
after the routing of the nets as a function of congestion between nets of the sub-netlist:
merging the nets of the netlist; and
determining the two or more nets that are routed through the one routing resource; and
after the routing each of the two or more nets of the netlist as a function of the global congestion history data set and congestion between nets of the sub-netlist of the net:
merging the routed nets of the netlist; and
determining nets that are routed through a routing resource with another net.

3. The method of claim 1, wherein the grouping of nets of the netlist into sub-netlists includes deterministically grouping nets.

4. The method of claim 1, wherein:
the routing of nets of each sub-netlist as a function of congestion between nets of the sub-netlist includes deterministically routing the nets of each sub-netlist in series; and
the routing of each of the two or more nets of the netlist as a function of the global congestion history data set and congestion between nets within the sub-netlist that includes the net, deterministically routes the two or more nets within the sub-netlist in series.

5. The method of claim 1, wherein the routing of nets for each sub-netlist as a function of congestion between nets of the sub-netlist, includes routing one or more nets of a first one of the sub-netlists in parallel with routing one or more nets of at least a second one of the sub-netlists using a plurality of processors.

6. The method of claim 1, wherein the routing of the two or more nets of the netlist includes routing one or more nets of the two or more nets within a first one of the sub-netlists in parallel with routing one or more nets of the two or more nets within at least a second one of the sub-netlists using a plurality of processors.

7. The method of claim 5, wherein the routing of nets for each sub-netlist as a function of congestion between nets of the sub-netlist includes routing nets of the first one of the sub-netlists sequentially with nets of at least a third one of the sub-netlists using one of the plurality of processors.

8. The method of claim 5, wherein the number of sub-netlists is greater than the number of processors in the plurality of processors.

9. The method of claim 1, wherein the number of sub-netlists is equal to the number of nets in the netlist.

10. A system for parallel routing of a circuit design, the system comprising:
a plurality of processors; and
a memory arrangement coupled to the plurality of processors, wherein the memory arrangement is configured with instructions that when executed by one or more of the plurality of processors cause the plurality of processors to perform operations including:
grouping nets of the netlist into a plurality of sub-netlists, each sub-netlist including one or more nets;
for each sub-netlist, routing each net in the sub-netlist as a function of congestion between nets of the sub-netlist, the function not being dependent on congestion between nets of other sub-netlists in the plurality of sub-netlists; and
after routing each net of each sub-netlist and in response to two or more nets of the netlist being routed through one routing resource:
grouping the two or more nets of the netlist into a revised set of sub-netlists;
updating a global congestion history data set with congestion data that describe congestion between all nets in the netlist;
undoing routes of the two or more nets of the netlist through the one routing resource; and for each of the two or more nets, routing the net as a function of the global congestion history data set and congestion between nets of the revised set of sub-netlists that includes the net, the function not being dependent on congestion between nets of other sub-netlists in the plurality of sub-netlists.

11. The system of claim 10, wherein the instructions further cause the plurality of processors to perform operations including:
after the routing of the nets as a function of congestion between nets of the sub-netlist:
merging the nets of the netlist; and
determining the two or more nets that are routed through the one routing resource; and
after the routing each of the two or more nets of the netlist as a function of the global congestion history data set and congestion between nets of the sub-netlist that includes the net:
merging the routed nets of the netlist; and
determining nets that are routed through a routing resource used to route another net.

12. The system of claim 10, wherein the grouping of nets of the netlist into sub-netlists consists of deterministically grouping nets.

13. The system of claim 10, wherein:
the routing of nets of each sub-netlist as a function of congestion between nets of the sub-netlist includes deterministically routing the nets of each sub-netlist in series; and
the routing of each of the two or more nets of the netlist as a function of the global congestion history data set and congestion between nets within the sub-netlist that includes the net, deterministically routes nets of the two or more nets within each sub-netlist in series.

14. The system of claim 1, wherein the routing of nets for each sub-netlist as a function of congestion between nets of the sub-netlist, includes routing one or more nets of a first one of the sub-netlists in parallel with routing one or more nets of at least a second one of the sub-netlists using a plurality of processors.

15. The system of claim 1, wherein the routing of the two or more nets of the netlist includes routing one or more nets of the two or more nets within a first one of the sub-netlists in parallel with routing one or more nets of the two or more nets within at least a second one of the sub-netlists using a plurality of processors.

16. The system of claim 14, wherein the routing of nets for each sub-netlist as a function of congestion between nets of the sub-netlist includes routing nets of the first one of the sub-netlists prior to routing nets of at least a third one of the sub-netlists using one of the plurality of processors.

17. An article of manufacture, comprising:
a non-transitory processor-readable storage medium configured with processor-executable instructions, the instructions when executed by a plurality of processors causing the plurality of processors to perform operations including:
grouping nets of the netlist into a plurality of sub-netlists, each sub-netlist including one or more of the nets;
for each sub-netlist, routing each net in the sub-netlist as a function of congestion between nets of the sub-netlist, the function not being dependent on congestion between nets of other sub-netlists in the plurality of sub-netlists; and
after routing each net of each sub-netlist and in response to two or more nets of the netlist being routed through one routing resource:
grouping the two or more nets of the netlist into a revised set of sub-netlists;
updating a global congestion history data set with congestion data that describe congestion between all nets in the netlist;
undoing routes of the two or more nets of the netlist through the one routing resource; and
for each of the two or more nets, routing the net as a function of the global congestion history data set and congestion between nets of the revised set of sub-netlists that includes the net, the function not being dependent on congestion between nets of other sub-netlists in the plurality of sub-netlists.

18. The article of claim 17, wherein the instructions further cause the plurality of processors to perform operations including:
after the routing of the nets as a function of congestion between nets of the sub-netlist:
merging the nets of the netlist; and
determining the two or more nets that are routed through the one routing resource; and
after the routing each of the two or more nets of the netlist as a function of the global congestion history data set and congestion between nets of the sub-netlist that includes the net:
merging the routed nets of the netlist; and
determining nets that are routed through a routing resource with another net.

* * * * *